United States Patent [19]

Argyle et al.

[11] 4,068,220
[45] Jan. 10, 1978

[54] CONTROLLABLE STATE CONVERSIONS FOR S=1 BUBBLE DOMAINS

[75] Inventors: Bernell Edwin Argyle, Putnam Valley, N.Y.; Pieter Dekker, Venlo, Netherlands; John Casimir Slonczewski, Katonah, N.Y.

[73] Assignee: International Business Machines Corporation, Armonk, N.Y.

[21] Appl. No.: 697,170

[22] Filed: June 17, 1976

[51] Int. Cl.$^2$ ............................................. G11C 11/14
[52] U.S. Cl. .......................................... 365/30; 365/7
[58] Field of Search ................................. 340/174 TF

[56] References Cited

U.S. PATENT DOCUMENTS 3,930,243   12/1975   Hsu et al. ..................... 340/174 TF

OTHER PUBLICATIONS

IBM Technical Disclosure Bulletin – vol. 17, No. 11, Apr. 1975, p. 3461.
Journal of Magnetism and Magnetic Materials – vol. 2, No. 4, 1976, pp. 357–360.

*Primary Examiner*—James W. Moffitt
*Attorney, Agent, or Firm*—Jackson E. Stanland

[57] ABSTRACT

A technique for controllably providing state conversions between bubble domains having a common winding number S is described. In particular, controlled conversions between bubble domains having winding number $S=1$ is achieved by the application of spatially invariant, homogeneous magnetic fields. For the conversion of $\sigma$ bubbles (having two vertical Bloch lines) to $\chi$ bubbles (having no vertical Bloch lines), an in-plane field is not required and only a time varying perpendicular z-field is used. For conversion of a $\chi_+$ bubble to a $\chi_-$ bubble, and vice versa, a time varying field pulse is applied, there being no requirement for an in-plane magnetic field. However, for the conversion of $\chi$ bubbles to $\sigma$ bubbles, an in-plane field is used simultaneously with a time varying z-field. For all controlled conversions, the applied magnetic fields do not have spatial gradients. The magnitudes of the applied magnetic fields and the rise and fall times of the z field are controlled within certain ranges in order to have controlled conversion of one state to another.

23 Claims, 16 Drawing Figures

FIG. IA
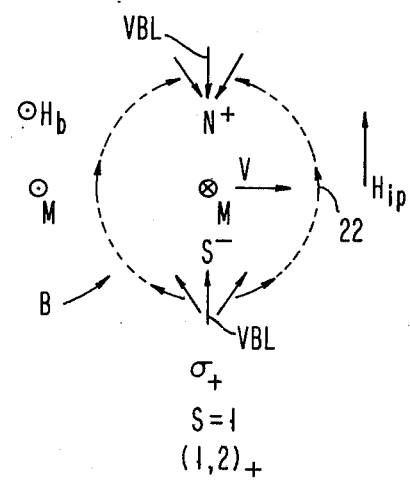
FIG. IB
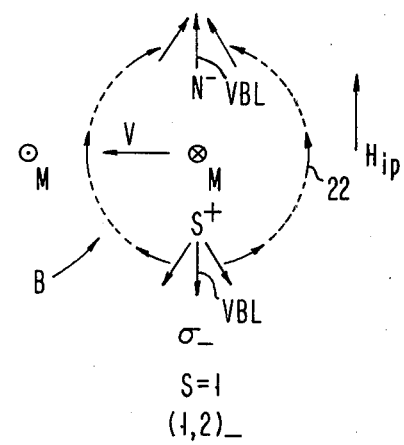
FIG. IC
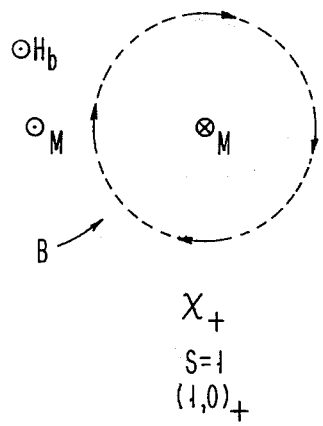
FIG. ID
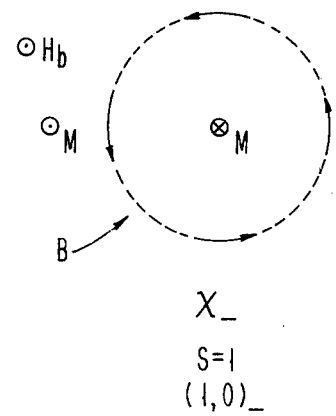

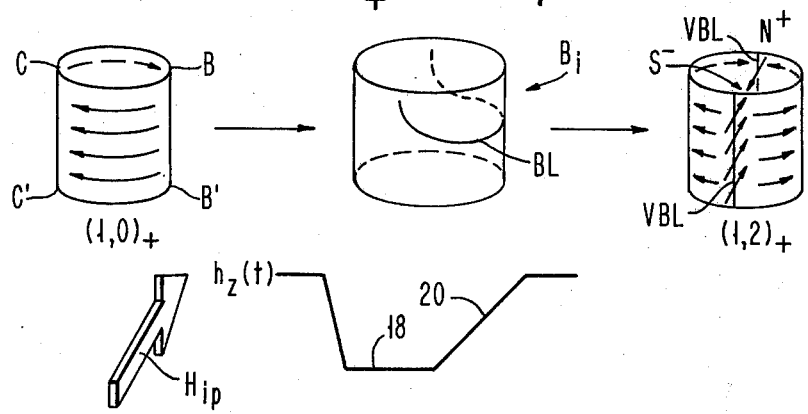
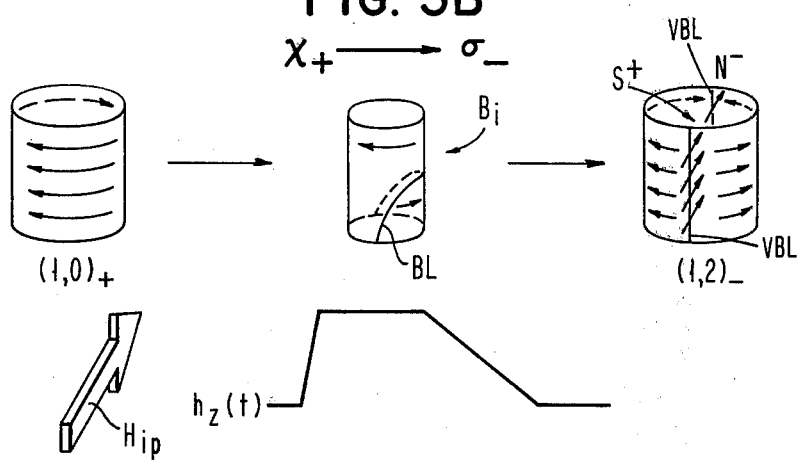
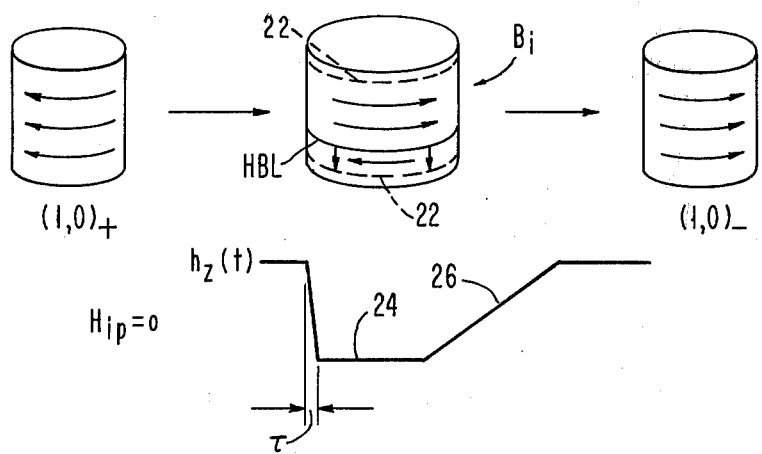

CONTROLLABLE STATE CONVERSIONS FOR S=1 BUBBLE DOMAINS

BACKGROUND OF THE INVENTION

1. Field of the Invention

This invention relates to controlled state conversions between magnetic bubble domains having common winding numbers, and more specifically to controlled state conversion between bubble domains having winding number $S=1$.

2. Description of the Prior Art

In bubble domain devices, coding of information is done in a variety of ways. While the most common is binary coding using the presence and absence of domains to represent information, other schemes, such as the bubble lattice file, use coding where all bit positions are filled with bubble domains. In the lattice file, information is encoded by means of the winding or revolution numbers of the bubbles. The winding number is the number of rotations made by the wall moment at a point P when P makes one circuit around the periphery of the bubble. Examples of this type of coding and a procedure for producing bubble domains having winding numbers $S=0$ and $S=1$ has been described by Ta-Lin Hsu, AIP Conference Proceedings 24, 624 (1975). Generally, capping layers are used together with in-plane magnetic fields to provide stable bubble domain states having different winding numbers.

Detection of domains in a device such as the bubble lattice file is generally achieved by using a gradient deflection technique wherein bubbles having different winding numbers are deflected by different angles in a gradient magnetic field. This type of motion is described in U.S. Pat. No. 3,890,605 which describes bubble devices using coding in terms of the winding number of the domain.

In Applicants' copending application Ser. No. 659,880, filed Feb. 20, 1976, an "automotion" technique of distinguishing two wall states having the same winding number was described. For example, two automotion states were found for bubbles having a pair of unwinding vertical Bloch lines. These bubble domains were designated as $\sigma_+$ domains and $\sigma_-$ domains and differed only in the combinations of magnetic polarities and local winding of their Bloch line pairs. In that copending application, the possibility of state conversion was described if the magnetic fields used to move the bubbles were too large or too small, depending upon a particular situation. It was observed that state conversion would occur when Bloch Lines were made to move into one another, collide and then annihilate. However, controlled generation of selected domain states was not taught in that application. The conversion margin plots were used to describe the margins for movement of bubbles by automotion. If there were state conversion, they would be accidental and the resulting state would not be a state selected in advance. Rather, the resulting state would be random and not well defined.

In contrast with that, the present application is directed to a technique for providing controlled state conversions between bubble domains where selected states can be produced. Additionally, the states which are produced are those having the same winding numbers so that the present invention is directed to controlled state conversions between domains having the same winding numbers.

Bubble domains having no vertical Bloch lines (unichiral domains) have the same winding number as bubble domains having a single pair of unwinding Bloch lines. Unichiral bubbles are desirable for representation of information since the absence of Bloch lines therein avoids state destabilization through nucleation of Bloch points, a process generally described by J. C. Slonczewski, in the AIP Conference Proceedings 24, 613 (1975). However, it has not been possible to easily identify the right-handed and left-handed unichiral states.

Accordingly, the present invention describes techniques for converting unichiral bubbles into $\sigma$ bubbles having the same winding number. Thus, devices using unichiral bubbles are now more practical, since the detectors need only provide state conversion from a unichiral bubble to a $\sigma$ bubble which is readily detectable using the principle of automotion. Thus, a device using unichiral bubbles, such as a bubble lattice file, would utilize a two-stage detector, where the first stage converts the unichiral bubble to a $\sigma$ bubble, while the second stage detects the resulting $\sigma$ bubble. Afterward, this $\sigma$ bubble or a newly nucleated one can be reconverted to its original unichiral state and then returned to storage.

Whereas the prior art used gradient techniques for providing $S=0$ and $S=1$ bubble domains, the present invention provides selected state conversions between bubble domains having the same winding number. Further, homogeneous magnetic fields having no spatial gradients are used.

Accordingly, it is a primary object of the present invention to provide controlled state conversion among bubble domains having the same winding number.

It is another object of the present invention to provide controlled state conversions between selected bubble domains having the same winding number using homogeneous magnetic fields.

It is another object to provide a technique for switching at will among domains having $S=1$ state using spatially uniform external magnetic fields.

It is a further object to provide a method and means for controllably providing state conversions between different bubble domain states having the same winding number, without the need for capping layers on the magnetic bubble domain material.

It is a still further object of this invention to provide techniques for switching between bubble domain states having the same winding number without requiring magnetic field gradients.

BRIEF SUMMARY OF THE INVENTION

In the practice of the present invention, both methods and apparatus are described for switching magnetic bubbles between different magnetic wall states having the same winding number. Operating margins for these transitions are described, and this type of controlled conversion allows a distinction to be made between right-handed and left-handed unichiral states.

In the particular case of bubble domains having unit winding number $S=1$ (where the winding number is the number of revolutions made by the wall magnetization vector around the periphery of the domain wall), controlled state transitions between bubble domains having two vertical Bloch lines and bubble domains having no vertical Bloch lines are described. These techniques involve the application of magnetic fields to the bubble domains, where one magnetic field is applied in the plane of the magnetic medium in which the bubble domains exist and the other magnetic field is applied normal to the plane of the magnetic medium in which the bubbles exist. More particularly, one magnetic field $H_z(t)$ is applied along the direction of magnetization of the domain, while the other magnetic field $H_{ip}$ is directed perpendicularly to the direction of magnetization in the bubble domain. Both $H_{ip}$ and $H_z(t)$ are magnetic fields having no spatial gradients. That is, they are spatially uniform magnetic fields where the field $H_z(t)$ is time varying.

When switching from a bubble state having two vertical Bloch lines ($\sigma$ state) to a bubble state having no vertical Bloch lines ($\chi$ state), no in-plane magnetic field $H_{ip}$ is required. This is also the case when bubble domains are switched between right-handed and left-handed $\chi$ states. However, when bubble domains having no Bloch lines ($\chi$ states) are switched to bubble states having two vertical Bloch lines ($\sigma$ states), an in-plane magnetic field $H_{ip}$ is simultaneously present with the z field $H_z(t)$.

Controlled switching between these bubble domain states is more simply achieved by a single step $H_z(t)$ of suitable amplitude $h_s$ and linear rise time $\tau$. The amplitudes of $H_z(t)$ and $H_{ip}$, as well as the rise time $\tau$ of $H_z(t)$ are carefully chosen to provide a controlled switch in bubble domain state. Thus, as will be more apparent, these parameters must be carefully selected in order to provide controlled state conversion.

These and other objects, features, and advantages will be more apparent from the following more particular description of the preferred embodiments.

BRIEF DESCRIPTION OF THE DRAWINGS

FIGS. 1A–1B illustrate various $s=1$ bubble domains. More specifically, FIG. 1A shows a wall magnetization structure of a $\sigma_+$ domain, while FIG. 1B shows the wall magnetization structure of a $\sigma_-$ domain. FIG. 1C shows the wall magnetization structure of a $\chi_+$ domain, while FIG. 1D shows the wall magnetization structure of a $\chi_-$ domain.

FIG. 3A illustrates the controlled conversion of a $\chi_+$ domain to a $\sigma_+$ domain.

FIG. 3B illustrates the controlled conversion of a $\chi_+$ domain to a $\sigma_-$ domain.

FIG. 4 illustrates controlled conversions between $\chi_+$ and $\chi_-$ domains.

DETAILED DESCRIPTION OF THE PREFERRED EMBODIMENTS

FIGS. 1A–1D

Figure 2A:
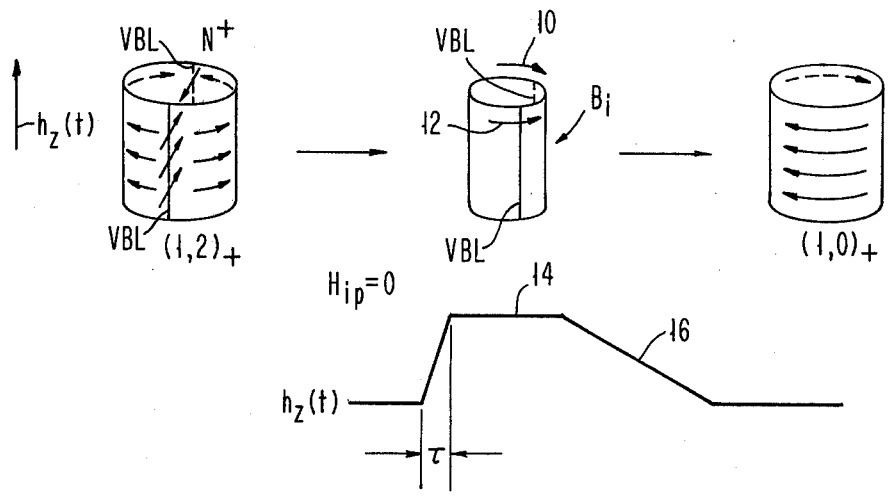
FIG. 2A schematically represents the controlled state conversion of a $\sigma_+$ domain to a $\chi_+$ domain.

These figures illustrate specific examples of static bubble domains having winding numbers $S=1$. FIG. 1A shows a $\sigma_+$ bubble domain, while FIG. 1B shows a $\sigma_-$ bubble domain. As is apparent, the $\sigma$ bubbles each have a pair of unwinding vertical Bloch lines VBL. In accordance with the teaching of aforementioned co-application Ser. No. 659,880, the $\sigma$ bubbles can be distinguished from one another using the principles of automotion.

The winding number s, or revolution number, is the number of rotations the wall moment at a point P makes when P goes once around the periphery of the domain wall. It is described in more detail in U.S. Pat. No. 3,890,605 and in an article by J. C. Slonczewski et al which appeared in the AIP Conference Proceedings 10, page 458 (1973).

In FIGS. 1A–1D, the bubble domain B has a magnetization M inside the domain which is directed into the paper while the magnetization M outside the bubble is directed out of the paper. Except in the vicinity of the vertical Bloch lines where it twists rapidly, the wall moment forms an acute angle with the vector $H_{ip}$. At the vertical Bloch lines north (N) and south (S) magnetic poles thus form and are held by $H_{ip}$ in positions on the bubble diameter parallel to $H_{ip}$. Depending on the directions of rotation of the moments in the vertical Bloch line regions, each vertical Bloch line contributes $\pm \frac{1}{2}$ to the winding number.

In these drawings, a bias field $H_z = H_b + h_z(t)$ is applied in a direction along the direction of magnetization M outside the bubble. In FIGS. 1A–1D, $h_z(t)$ is 0 so that the only field directed along the axis of the bubble is the bias field $H_b$. This is maintained and used to stablize the diameter of the domain, as is well known. Further, an in-plane magnetic field $H_{ip}$ is shown in the direction indicated.

FIGS. 1C and 1D show two other bubble domains which have winding number $S=1$. These are $\chi$ domains which differ from the $\sigma$ state domains in that they have no unwinding vertical Bloch lines. Thus, these are unichiral bubble domains in which the wall magnetization vector field circulates in the same direction around the entire periphery of the domain. The field $H_b$ and the magnetization vectors M inside and outside the domain are the same as those which were described with respect to FIGS. 1A and 1B.

Unichiral bubbles do not automote in response to rectangular pulses in the manner described in co-pending application Ser. No. 659,880. However, unichiral bubbles are well suited for representing information because the absence of vertical Bloch lines in these bubbles prevents state destabilization through nucleation of Bloch points when the bubbles are moved in a magnetic medium at velocities lying below the critical velocity for Bloch line nucleation. The general process of state destabilization by motion of Bloch points along bloch lines is described in more detail in an article by J. C. Slonczewski which appeared in the AIP Conference Proceedings 24, page 613 (1975). As will be seen more clearly later, the present invention allows devices in which unichiral bubbles $\chi_+$ and $\chi_-$ are used to represent information in a bubble domain memory. Previously, it was not possible to distinguish $\chi_+$ and $\chi_-$ bubbles using the usual techniques of deflection in a gradient field. However, the $\chi$ bubbles can be controllably converted to $\sigma_+$ and $\sigma_-$ bubbles in accordance with the present invention. These $\sigma$ bubbles can then be distinguished using the principles of automotion so that a technique now exists for detection of $\chi_+$ and $\chi_-$ bubbles.

In FIGS. 1A – 1D, the various bubble states are also represented by the notation $(1, n)$ where $n$ is either 0 or 2. This notation describes an $S=1$ bubble with $n$ vertical Bloch lines. Thus, the first number in the parenthesis represents the winding number, while the second number represents the number of vertical Bloch lines in the bubble. Therefore, $\sigma$ bubbles are identified by the notation (1,2) while $\chi$ bubbles are identified by the notation (1,0). The vertical Bloch lines in the (1,2) bubbles have magnetic polarities N and S and twist numbers $\pm \frac{1}{2}$ indicated by the superscripts $\pm$ and occupy equilibrium positions determined by $H_{ip}$. The two (1,2) states differ by the combinations N+ S− for $\sigma_+$ and N− S+ for $\sigma_-$. Thus, the $\sigma_+$ domain is denoted $(1,2)_+$ while the $\sigma_-$ domain is denoted $(1,2)_-$.

As taught in aforementioned co-pending application Ser. No. 659,880, pulsed or sinusoidal modulation $H_z = H_b + h_z(t)$ causes $(1,2)_\pm$ domains to move ("automode") in the directions $\pm (\vec{H}_{ip} \times \vec{H}_b)$ respectively (neglecting the small gyrotropic deflection), as indicated by the arrows V in FIGS. 1A and 1B.

CONTROLLED SWITCHING

Controlled switching among the $\sigma$ and $\chi$-state bubbles is achieved in accordance with the principles of the present invention by applying homogeneous magnetic fields to the domains (or by removing homogeneous magnetic fields). Magnetic fields having spatial gradients are not required and switching between selected states is controllably obtained. To achieve this, the amplitudes and rise times of the magnetic fields utilized are controlled to provide selected state conversions, without producing unwanted state conversions.

THEORY

Figure 5A:
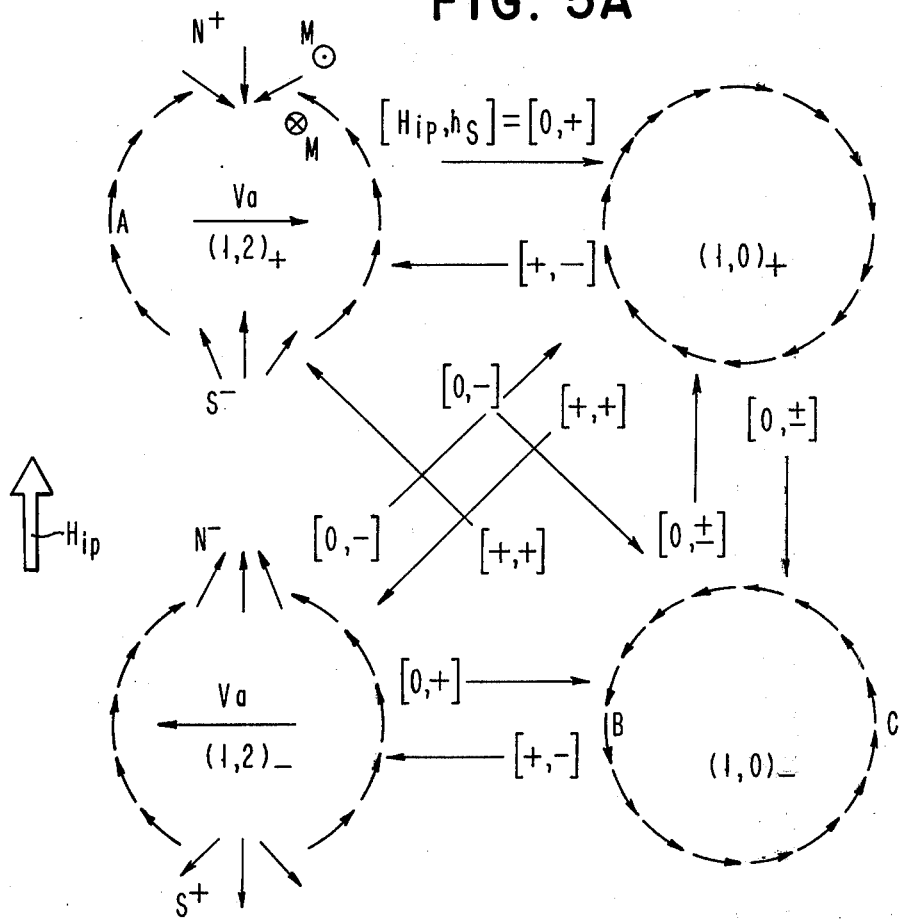
FIG. 5A schematically illustrates the bubble states $\sigma_\pm(1,2)_\pm$ and $\chi_\pm(1,0)_\pm$ and the combinations of $H_{ip}(0$ or $+)$ and $h_s(+$ or $-)$ required for controlled transitions between these bubble domain states.
Figure 5B:
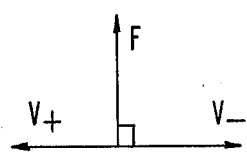
FIG. 5B indicates the force-velocity relation for vertical Bloch lines when the conversions illustrated in FIG. 5A occur.

Ideally, switching between any two states (except $(1,2)_+ \rightleftarrows (1,2)_-$) is done most simply by a single step $h_z(t)$ of amplitude $h_s$ and linear rise time $\tau$. In the laboratory, the step is approximated by the leading edge of a trapezoidal pulse (FIGS. 2A, 2B, 3A, 3B and 4) whose plateau and fall times are great enough to return the bubble radius adiabatically to its initial value without further state changes. The field produces a pressure on the wall of the bubble tending to expand ($h_s < 0$) or contract ($h_s > 0$) it. It also produces forces on existing Bloch lines (BLs) and may nucleate new BLs. Any force $\vec{F}$ per unit length on a BL (which may be curved) with a twist angle $\pm \pi$ imparts a velocity 1. $\vec{V}_\pm = \pm (\gamma/2\pi M)\vec{e} \times \vec{F}$ where $\vec{e}$ is the unit vector tangent to the BL, M is the spontaneous magnetization, and $\gamma$ is the gyromagnetic ratio. The sign depends on the direction of the gyrovector within the BL. FIG. 5B indicates the geometric relationships between $\vec{F}$ and $\vec{V}_\pm$ for vertical Bloch lines (V BLs) ($\vec{e} = \vec{e}_z$).

State changes may thus be caused by the processes of BL nucleation, propagation, and annihilation induced by $h_z(t)$. The sign of $h_s$ is chosen according to the state change desired. In addition, $H_{ip}$ is set equal to 0 if the final state is to be $(1,0)_\pm$ and $H_{ip}$ is set $> 0$ if it is to be $(1,2)_\pm$. The direction of $H_{ip}$ is immaterial. The combinations of $H_{ip}$ (0 or +) and $h_s$ (+ or −) required for the 10 distinct state conversions will be explained in more detail with respect to FIGS. 2A, 2B, 3A, 3B and 4. A summary of the combinations of $H_{ip}$ and $h_s$ is shown in FIG. 5A.

DETAILED DISCUSSION OF STATE CONVERSIONS (FIGS. 2A, 2B, 3A, 3B and 4)

These figures schematically indicate controlled state conversions between bubble domains having a common winding number $S = 1$. In each of the Figures, the initial state of the domain is shown, together with an intermediate state and finally the resulting state to which the domain is converted. The magnetic fields $H_{ip}$ and $h_z(t)$ required for the conversion are also illustrated schematically. Although it is not shown in these drawings, it is understood that the constant bias field $H_b$ is used to maintain the radius of the domains.

FIG. 2A shows the controlled conversion of a $\sigma_+$ domain to a $\chi_+$ domain. To achieve this conversion, a field $h_z(t) > 0$ is applied, in the absence of the in-plane field $H_{ip}$. In order to change the $\sigma$ domain to a $\chi$ domain, the two unwinding vertical Bloch lines in the $\sigma$ domain must be eliminated. Since, as will be more apparent later, the in-plane field $H_{ip}$ is used to destabilize wall magnetization in a domain for creation of curved Bloch lines and for separation of vertical Bloch lines, such a field is not needed where the vertical Bloch lines are to be eliminated. Further, $h_s$ could be + or − in order to provide the required $\sigma$ to $\chi$ conversion.

The pulse $h_z(t)$ has a leading edge with a rise time $\tau$ which is chosen in accordance with the conversion to be made. If $\tau$ is too small, $h_s$ will vary too rapidly and the velocity of the wall will exceed the critical velocity $V_c$. Exceeding $V_c$ will cause new Bloch lines to be nucleated in accordance with the teaching of A. Hubert, Journal of Applied Physics 46, 2276 (1975). Thus, rather than eliminating Bloch lines, a pulse $h_z(t)$ having too small a rise time will nucleate Bloch lines and the controlled conversion to a $\chi$ state will not be obtained.

On the other hand, if the leading edge rise time $\tau$ is too large, $h_z(t)$ will vary too slowly which will mean that the domain wall moves too slowly. Thus, a quasi-equilibrium will occur and the vertical Bloch lines VBL will not circulate far around the domain to meet and be annihilated. Thus, even though the radius of the domain will change as a result of $h_z(t)$, the domain wall will be able to maintain itself in quasi-equilibrium so that the net force on the vertical Bloch lines will then be very small, the now stationary vertical Bloch lines will never be eliminated and the conversion to a $\chi$ bubble will not be obtained.

In FIG. 2A, the intermediate bubble state, designated $B_i$, between the $\sigma_+$ bubble and the $\chi_+$ bubble shows that the vertical Bloch lines in the $\sigma$ bubble are moving rightward toward one another as indicated by the arrows 10 and 12. These vertical Bloch lines move toward one another until they collide and annihilate on the right-hand side of the domain $B_i$. Thus, the domain has a final state characterized by the absence of vertical Bloch lines, which is the $\chi$ state. In FIG. 2A, a $\sigma_+$ domain is converted to a $\chi_+$ domain as is apparent from the direction of wall magnetization around the $\chi$ domain.

The plateau time 14 and fall time 16 of $h_z(t)$ must be sufficiently great so as not to interfere with the state change intended. The plateau time must be sufficient to allow the Bloch lines to annihilate and the state change thus to complete itself. The fall time must be sufficiently long that the domain radius is restored to its initial value in a quasi-static manner without additional state change taking place. This means that the radial velocity on return must be insufficient for Bloch line nucleation.

The rise time $\tau$ of the leading edge of the pulse is chosen small enough, for a given amplitude of the pulse that the dynamical radius of the domain substantially lags behind the quasi-static radius corresponding to the instantaneous $h_z(t)$. This lag provides the force impelling the Bloch lines toward collision. After the desired change has been made (in this case removal of the Bloch lines), the length of the rest of the pulse is not critical. It is chosen long enough to allow the desired change to occur and then to not again change the state of the domain. Of course, it should be recognized that the trailing edge of the pulse can also be used to provide a selected state change if this is desired. Thus, for example, the $\sigma_+$ domain shown in FIG. 2A could be changed to a $\chi_-$ domain using a sufficiently slow rise time so that no switch takes place until after the step of sufficiently fast fall time on the trailing edge 16 of the pulse. The sign of $h_s$ must also be reversed, it should be noted, to produce the same switch.

Figure 2B:
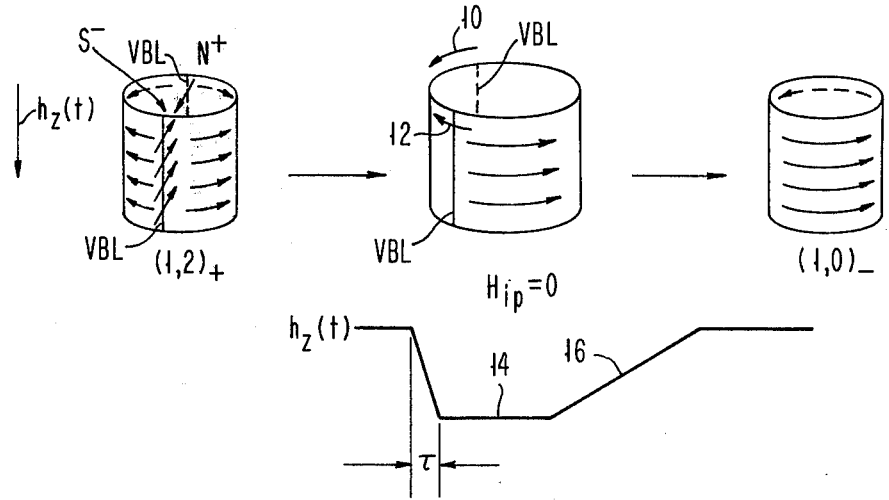
FIG. 2B illustrates the controlled conversion of a $\sigma_+$ domain to a $\chi_-$ domain.

In FIG. 2B, a schematic representation is shown of a controlled transition from a $\sigma_+$ state to a $\chi_-$ state. The intermediate bubble $B_i$ is shown between the initial $\sigma_+$ bubble and the resulting $\chi_-$ bubble. This transition is similar to the transition described with respect FIG. 2A. That is, the vertical Bloch lines in the $\sigma_+$ bubble are moved to the left to collide and annihilate in order to leave a bubble domain having no vertical Bloch lines. The resulting magnetization state is that of the $\chi_-$ domain. The pulse $h_z(t)$ is a negative pulse which moves the vertical Bloch lines to the left in order to enlarge the region of counterclockwise circulating magnetic moments in the wall of the $\chi$-domain and to diminish the region of clockwise circulating magnetic moments. This means that the counterclockwise wall moments required in a $\chi_-$ bubble will be preserved so that the controlled transition has been achieved.

As with FIG. 2A, the arrows indicating the direction of movement of the vertical Bloch lines are designated 10 and 12, in FIG. 2B.

$\chi \ \sigma$ CONVERSION - FIGS. 3A and 3B

These figures illustrate switching from a $\chi$ state to a $\sigma$ state. More particularly, FIG. 3A shows a transition from a $\chi_+$ bubble to a $\sigma_+$ bubble, while FIG. 3B shows a transition from a $\chi_+$ bubble to a $\sigma_-$ bubble. To change a $\chi$ bubble to a $\sigma$ bubble requires the generation of two vertical Bloch lines, since the $\chi$ bubble has no vertical Bloch lines in its wall magnetization. The in-plane field $H_{ip}$ is present for this conversion in order to allow the initial generation of a Bloch curve in the $\chi$ bubble, and subsequently to insure that vertical Bloch lines will be generated and kept separate from one another. Thus, $H_{ip}$ is used to help destabilize the magnetic state of the $\chi$ bubble in a manner to generate vertical Bloch lines, by allowing the Bloch curve to move across the surface of the domain wall under the combined influence of the magnetic pulse $h_z(t)$ and the steady field $H_{ip}$.

The magnitudes of the fields $H_{ip}, h_z(t)$ and the rise and fall times of $h_z(t)$ are chosen so that only two vertical Bloch lines will be generated.

In FIG. 3A a $\chi_+$ bubble is transformed to a $\sigma_+$ bubble by the application of in-plane field $H_{ip}$ and z-field pulse $h_z(t)$. The intermediate bubble state $B_i$ illustrates the generation of a Bloch line (curve) BL due to a local destabilization of the wall of the $\chi$ bubble by $H_{ip}$. The curved Bloch line BL moves from the bottom edge of the bubble $B_i$ to the top when $h_z(t)$ is present. The Bloch line will punch through the top surface of the bubble to leave two vertical Bloch lines VBL which are shown in the $\sigma_+$ bubble on the right hand side of this figure. The consideration for the rise and fall times of the leading and trailing edges of the z field pulse $h_z(t)$ are similar to those described with respect to $\sigma$ to $\chi$ conversion. In this case, however, the rise time of the z field pulse must be rapid enough to generate curved Bloch lines in the $\chi$ bubble. If the rise time is too slow, the bubble domain radius will change at approximately the same rate as the rate of change of $h_z(t)$ and therefore a quasi-equilibrium situation will exist where the $\chi$ bubble primarily changes in size, rather than changing in its configuration of wall magnetization.

Once the Bloch line BL punches through to the surface of the domain $B_i$, two vertical Bloch lines are generated and the $\sigma$ state is achieved. The continued presence of the field $H_{ip}$ keeps these vertical Bloch lines from moving toward one another and annihilating. Thus, $H_{ip}$ keeps the vertical Bloch lines diametrically opposite to one another.

As mentioned, $H_{ip}$ is used to destabilize the magnetization state of the $\chi$ domain. This field produces an essential asymmetry. Wherever (at line BB', FIG. 3A) it opposes the direction of wall moment $\chi$ bubble, it tends to destabilize the wall structure and thus decreases the critical velocity necessary for Bloch line nucleation (as described in the aforementioned technical paper by A. Hubert). Wherever $H_{ip}$ is parallel to the wall moment (along line CC', FIG. 3A), it increases the critical velocity. Thus, an appropriate combination of $h_s$ and rise time $\tau$ will propagate the bulge of a curved Bloch line BL, nucleated at point B, from a critical circle near one bubble domain film surface toward the other surface. In FIG. 3A, the Bloch line BL is nucleated at point B at a critical circle near the upper surface of the bubble domain and is moved to the bottom of this domain. There, the Bloch curve is severed into a pair of vertical unwinding Bloch lines by the mechanism of "punch through" which was calculated by A. Hubert, referenced above. This combination of vertical Bloch lines, with the signatures N+5, constitutes the $\sigma_+$ state $(1,2)_+$. $H_{ip}$ ultimately impels these Bloch lines to the equilibrium position shown in the $\sigma_+$ bubbled on the right of FIG. 3A.

The plateau 18 and trailing edge 20 of the pulse $h_z(t)$ are chosen with the same considerations in mind that existed for the $\sigma$ to $\chi$ conversions. That is, the plateau 18 should be long enough to allow the generation of vertical Bloch lines and the fall time of the trailing edge 20 of the field pulse should be gradual enough so as not to cause further state changes, if these are not desired. Of course, this trailing edge can be used to provide another state conversion in the manner mentioned previously.

Although it is not shown until FIG. 5, the sequence of events for a $\chi_-$ to $\sigma_+$ conversion resembles that for a $\sigma_+$ to a $\chi_-$ conversion, in reverse order.

CONVERSION BETWEEN $\chi$ STATES (FIG. 4)

This figure shows a conversion from a $\chi_+$ state to a $\chi_-$ state, and vice versa. In this conversion, the applied magnetic fields are such that vertical Bloch lines are not generated or annihilated. Rather, a horizontal Bloch line HBL is generated and is propagated from one surface of the domain to the other surface in order to change the direction of magnetization in the domain.

Chiral reversal is geometrically more simple to describe than the conversions between the $\sigma$ and $\chi$ states, because the process is axially symmetric. If the pressure $2Mh_z(t)$ on the wall rises rapidly enough, a circular Bloch line BL nucleates along one critical circle (see A. Hubert, reference cited above) of the bubble and moves toward the other. The circular shape of this BL is preserved because of the absence of $H_{ip}$. After punchthrough of the first BL, the sense of the chirality has changed. Then a second Bloch line may nucleate and the process may repeat itself $n$ times within the duration of one z field pulse $h_z(t)$.

Thus, in FIG. 4, a horizontal Bloch line HBL is nucleated near the upper critical circle (indicated by the dashed line 22) and moves upwards toward the lower critical circle. This causes a reversal in the direction of magnetization of the $\chi_+$ domain.

$K[r(t)-r_o]$, where $r_o$ is the initial radius and $K(>0)$ is a constant, is written for the linearized field equivalent to the restoring force provided by bubble magnetostatics. Then, if the consecutive BLs are regarded as having a twist $\pm\pi$, their cumulative displacement $z(t)$ in units of bubble film thickness will, according to Eq. (1), satisfy 2. $(\pi\dot{z}/\gamma)+K(r-r_o) = |h_s t/\tau|$ or $|h_s|$ for $t <$ or $> \tau$, respectively, where $\dot{z} = dz/dt$. For simplicity it is assumed that $r(t)-r_o = V_s t$, where $V_s(>0)$ is the mean or saturation velocity, due to domain stray fields, of the wall containing one horizontal BL (see paper of A. Hubert, referenced above). Under the condition $|h_s|>KV_s\tau$, Eq. (2) may be integrated with the boundary conditions $z(0) = 0$, $z(h_s/KV_s) = n$ ($n$ BLs have traveled the distance $z=1$) to find the critical $\tau_n$, given by 3. $\tau_n = |h_s/KV_s| - |2n\pi/\gamma h_s|$ for the $n^{th}$ chiral switch.

The plateau 24 and trailing edge 26 of the field pulse $h_z(t)$ are long enough to maintain equilibrium of the radius of the domain. That is, the plateau and slope of the trailing edge 26 are chosen so that the state which has been created by the leading edge of the field $h_z(t)$ will remain thereafter. Of course, the trailing edge can be used to provide other selected state conversions in the manner indicated previously.

FIGS. 5A AND 5B

These figures schematically illustrate the bubble states $(1,2)_\pm$ and $(1,0)_\pm$ and the combinations of $H_{ip}(0$ or $+)$ and $h_s(+$ or $-)$ required for selected state conversions between the different bubble domain states. FIG. 5B indicates the force-velocity relation for Bloch lines during these selected transitions. Thus, FIG. 5B illustrates the geometric relationships between $\vec{F}$ and $\vec{V}_\pm$ for vertical Bloch lines ($\vec{e} = \vec{e_z}$), in accordance with equation 1.

FIG. 5A summarizes the selective transitions that can be made to occur using the magnetic fields $H_{ip}$ and $h_z(t)$, both of which are fields characterized by the absence of spatial gradients. The field $h_z(t)$ produces a pressure on the wall of the bubble tending to expand or contract it depending upon the sign of $h_s$. This field also produces forces on existing Bloch lines and may nucleate new Bloch lines. The force $\vec{F}$ per unit length on the Bloch line having a specified twist angle imparts a velocity to the Bloch line given by equation 1. The velocity vectors $V_a$ shown in FIG. 5A are the automotion velocity vectors for $\sigma_+$ and $\sigma_-$ bubbles.

State changes are caused by the processes of Bloch line nucleation, propagation, and annihilation induced by $h_z(t)$ and $H_{ip}$. The sign of $h_s$ is chosen according to the state change which is desired. Additionally, $H_{ip}$ is set equal to 0 if the final state is to be a $\chi$ state and $H_{ip}$ is greater than 0 if it is to be a $\sigma$ state. The direction of $H_{ip}$ is in material, as was noted. In FIG. 5A, the combinations of $H_{ip}(0$ or $+)$ and $h_s(+$ or $-)$ required for each distinct state conversion are indicated within brackets.

Figure 6:
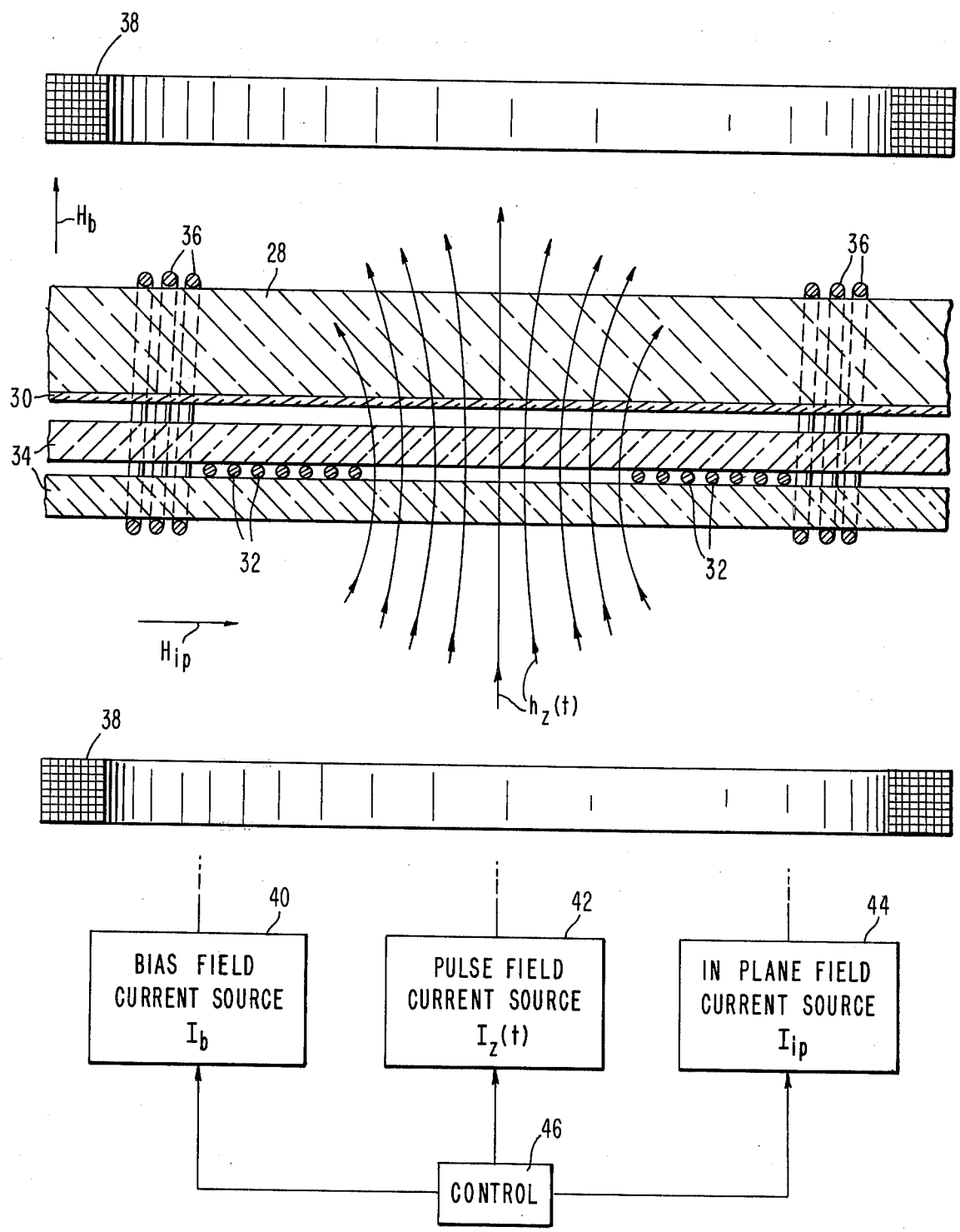
FIG. 6 illustrates the apparatus used to provide the magnetic fields necessary for controlled state conversions between bubble domains having common winding numbers.

APPARATUS FOR PRODUCING $H_{ip}$ AND $h_z(t)$ — FIG. 6

FIG. 6 shows an apparatus for producing the magnetic fields $H_{ip}$ and $h_z(t)$. A substrate 28 has a bubble domain film 30 thereon. Substrate 28 is typically a garnet substrate, such as $Gd_3Ga_5O_{12}$, while the bubble film 30 can be, for instance, a garnet composition of a type well known in the art. Other bubble domain materials, such as amorphous magnetic materials, can also be used with suitable substrates.

A helical pancake coil 32 is located between two glass plates 34 so that it can be brought close to the bubble domain film surface. Coil 32 is used to provide the field $h_z(t)$. The field lines produced by coil 32 are indicated in the drawing.

The current carrying coil 36 surrounding the bubble film 30 is used to provide the in-lane magnetic field $H_{ip}$, while the coil 38 is used to provide the static bias field $H_b$. Coil 36 can be comprised of separate portions for providing the field $H_{ip}$ in any direction in the plane of bubble medium 30.

Current $I_b$ from bias field source 40 flows through bias coil 38 to produce field $H_b$. Current $I_z(t)$ is produced by pulse field current source 42 and flows through helical coil 32 to produce the field $h_z(t)$. Current $I_{ip}$ from in-plane field source 44 flows through coil 36 to produce field $H_{ip}$. The current sources 40, 42 and 44 are operated under control of control circuit 46. This control provides the timing pulses to each of the current sources to produce magnetic fields $H_b$, $h_z(t)$, and $H_{ip}$ of any desired amplitudes, durations, rise times, directions, etc. These current sources are well known circuits as is the control unit 46.

EXAMPLES (FIGS. 7A, 7B, 8, and 9)

These figures describe various operating margins for state conversion in accordance with the principles taught herein. In particular, a garnet film having the composition $Gd,Y,Tm,Fe_{4.2}Ga_{0.8}O_{12}$ was used for the conversion studies. The material parameters for this garnet were as follows:

$\alpha = 0.045$ $\gamma = 1.3 \times 10^7 \text{ Oe}^{-1}\text{sec}^{-1}$ $M = 15$ gauss $K_u = 10.5 \times 10^3 \text{ ergs/cm}^3$ $K = 5.7 \text{ Oe}/\mu\text{m}$ $h = 3.8 \mu\text{m}$ $Q \simeq 8$ The bias field $H_b$ was set equal to 52 Oe, so that a radius $r_O = 3$ microns was obtained. The states $\sigma_+$, $\sigma_-$, and $\chi$ (non-automoting) were distinguished after each attempted switch operation by testing for automotion with 100 rectangular bias field pulses per second having amplitude $H_a = -6$ Oe, and rise and fall times of 15 ns in the presence of $H_{ip} = 12$ Oe. Additionally, gradient propagation confirmed the $S=1$ character of the $\chi$ bubbles.

The nature of these state changes occurring during sequences of two or three pulse procedures was investigated. Before each sequence a series of gradient pulses normal to $H_{ip}$ moved an $S=1$ test bubble up to the test position. These pulses had whichever initial state $\sigma_+$ or $\sigma_-$ was desired, for it was found that the bubble would subsequently automote in the same direction as it had been propagated.

Values of $H_{ip}$ and $h_s$ were adjusted by trial and error until the scheme of FIG. 5A was confirmed. While absence of automotion cannot by itself demonstrate that the $\chi$ state is a doublet, its use in switching combinations can do so. For example, the combination of $$\sigma_+ \xrightarrow{[0-]} \chi \xrightarrow{[+-]} \sigma_- \text{ with } \sigma_- \xrightarrow{[0-]} \chi \xrightarrow{[+-]} \sigma_+$$

shows that the intermediate $\chi$ states must be different because the operation $[H_{ip}, h_s] = [+ -]$ acting on them produces different results. This observation justifies attaching different subscripts, $-$ and $+$ respectively, to $\chi$.

Observing the effects of changing $H_{ip}$ and $h_s$ on switches involving $\chi_+$ and $\chi_-$ shows that $\chi_{30}$ and $\chi_-$ are completely alike insofar as switching thresholds are concerned. Also, the absence of a "jump" following an $H_{ip}$ reversal and the absence of anomalous sideways displacement during gradient-propagation reversal prove that no vertical BLs are present. Therefore, identification of the $\chi_\pm$ states with the $(1,0)_\pm$ structures shown in FIG. 5A seems certain.

Figure 7A:
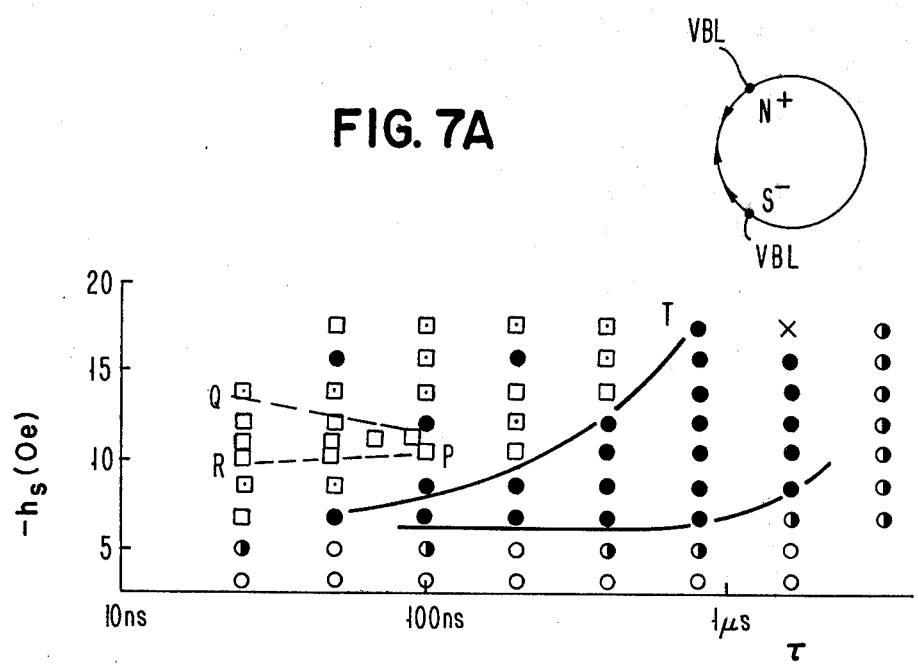
FIG. 7A shows an operating margin for the pulse amplitude $h_s$ and the rise time $\tau$ of the pulse shape indicated in FIG. 7B for the conversion of $\sigma_+$ to $\chi_-$ domains. The figure also illustrates other conversions which can occur depending upon the quantities $h_s$ and $\tau$. The inset shows the Bloch line mechanism for the $\sigma$ to $\chi$ conversion.

After confirming the switching scheme qualitatively, margins were measured for the transitions in the space $h_s$ vs $\tau$. Although domain contraction ($h_s > O$) produced similar results, expansion ($h_s < O$) was utilized in order to avoid frequent bubble collapse. (Even using one sign of $h_s$, any of the four states is accessible from any other by no more than 2 pulses.) Using ranges of $h_s$ and $\tau$ in the first switch of the sequence $$\sigma_+ \xrightarrow{[0-]} \chi_- \xrightarrow{[+-]} \sigma_-$$

established margins for $$\sigma_+ \xrightarrow{[0-]} \chi_-$$

shown in FIG. 7A. In addition to regions with the anticipated outcomes $\sigma_+$ and $\chi_-$, $\chi_+$ (detected by $$\chi_+ \xrightarrow{[+-]} \sigma_+)$$

was found in the region between the curves PQ and PR. In this region, two switches probably occurred within the compass of one pulse, so that the sequence went $$\sigma_+ \xrightarrow{[0-]} (\chi_- \longrightarrow) \chi_+$$

as expected from the scheme of FIG. 5A. In the region TPQ, where non-reproducible states were found, new BLs probably nucleate near the point C in FIG. 5A before the original BLs have annihilated.

In FIG. 7A, full dots are used to indicate the switch $\sigma_+ \rightarrow \chi_-$. The open squares are used to indicate a region of $h_s$ versus $\tau$ where the switch $\sigma_+ \rightarrow \chi_+$ occurs. Mixtures of switches $\sigma_+ \rightarrow (\chi_+$ and $\chi_-)$ are marked with a square having a dot therein. Regions where no state switch occurs are denoted by the open circles. Half open circles indicate regions where mixtures of no switch and $\sigma_+ \rightarrow \chi_-$ occur. The inset in FIG. 7A indicates the movement of the vertical Bloch lines during the switch $\sigma \rightarrow \chi$.

Figure 7B:
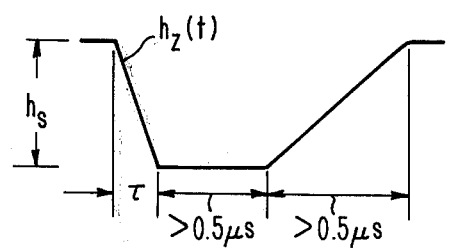
FIG. 7B indicates the pulse shape $h_z(t)$ used for the conversion illustrated in FIG. 7A.

FIG. 7B indicates the pulse shape $h_z(t)$ used to provide this margin plot.

FIG. 8

Figure 8:
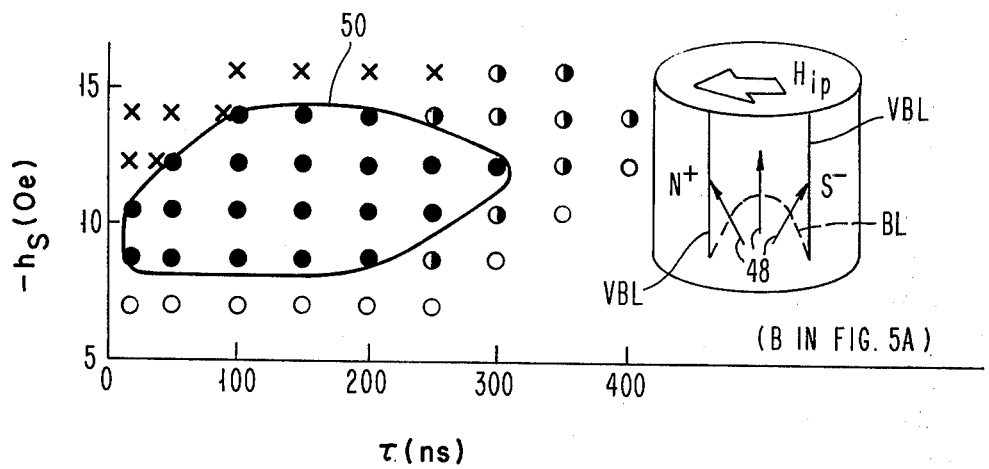
FIG. 8 is an operating margin plot for $\chi_+$ to $\sigma_+$ state changes. Other conversions are also illustrated in this margin plot while the inset shows the Bloch line mechanism during the switch transition.

FIG. 8 shows an operating margin for a $\chi_+ \rightarrow \sigma_+$ transition. This is a plot of $-h_s$ versus $\tau$ with $H_{ip} = 34$ Oe. The inset in this margin plot shows the intermediate bubble where a Bloch line BL is formed, moves upward in the direction of the arrows 48, and punches through at the top surface to produce the vertical Bloch lines VBL. The direction of $H_{ip}$ is also illustrated in the inset.

Although this is a margin plot for $\chi_+ \rightarrow \sigma_+$, the same margins exist for a transition from a $\chi_-$ state to a $\sigma_-$ state.

An analogous variation of $h_s$, $H_{ip}$, and $\tau$ in the second switch of the sequence described above with respect to FIG. 7A established the margins for the $\chi_+ \rightarrow \sigma_+$ transition shown in FIG. 8. The value $H_{ip} = 34$ Oe was used because it produced convenient ($h_s$, $\tau$) margins. With $H_{ip} < 22$ Oe, no combination of $h_s$ and $\tau$ produces the intended transition. If $H_{ip}$ is greater than 50 Oe, $S=0 \rightarrow S=1$ state changes narrow the $h_s$ range considerably.

In FIG. 8, full dots indicate $\chi_+ \rightarrow \sigma_+$ transitions, while open circles indicate no switch. Half open circles indicate a mixture of no switch and $\chi_+ \rightarrow \sigma_+$ switches. The crosses indicate that the resulting state is either $\sigma_+$ or $\sigma_-$ or $S=0$ bubbles. Thus, the region within the closed curve 50 indicates the safe operating margin for the $\chi_+ \rightarrow \sigma_+$ state conversion.

Figure 9:
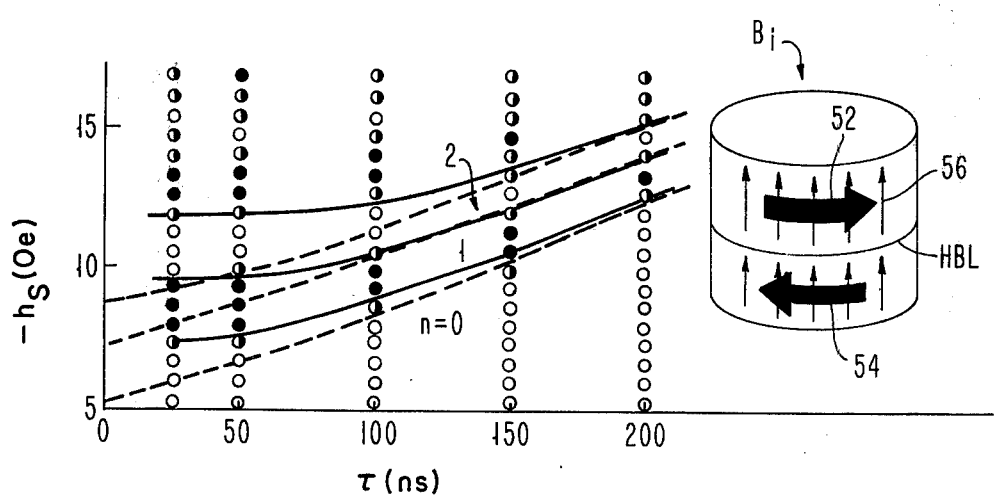
FIG. 9 shows the operating margins for $\chi$ switching between right-handed and left-handed $\chi$ states. The inset illustrates the Bloch line mechanism for this type of switching.

$\chi$ STATE TRANSITIONS (FIG. 9)

FIG. 9 illustrates the operating margin for chiral switching and in particular those for $\chi_- \rightarrow \chi_+$. The margins for this transition were obtained by a variation of $h_s$ and $\tau$ in the second switch of the sequence

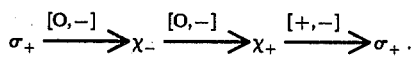

The threshold curves for single and multiple chirality reversal (the solid curves in FIG. 9) lie near the theoretical curves according to equation 3 above, with $n=1, 2, 3$ and assuming $V_S = 900$ cm/s. This is the saturation velocity of the domain and as adjusted compares reasonably to data obtained from bubble translation ($V_S = 1100$ cm/s) and bubble expansion ($V_S = 1400$ cm/s) extrapolated from high drive measurements). The observed widening of $h_s$ margins with increasing $\tau$ (up to 1 microsecond) for $\sigma \rightarrow \chi$ and their narrowing for $\chi \rightarrow \sigma$ is probably connected with the need to suppress Bloch line nucleation and punchthrough in the $\sigma \rightarrow \chi$ case and to excite these events in the $\chi \rightarrow \sigma$ case.

In FIG. 9, the inset shows an intermediate state in which a bubble having negative chirality (as indicated by the arrow 52 depicting a counterclockwise wall moment) changes to a chiral bubble having a positive chirality (as indicated by arrow 54 showing the positive chirality). In order to make this transition, a horizontal Bloch line HBL is nucleated which then travels upward in the direction of arrows 56 in order to change the wall moment direction of the portion of the domain $B_i$ located above HBL.

In FIG. 9, the full circles indicate the transition $\chi_- \rightarrow \chi_+$ while the open circles indicate $\chi_- \rightarrow \chi_-$. The half-open circles indicate mixtures of these transitions.

In the practice of this invention, it has been shown how to change bubble domains from one magnetization state to another, while preserving their winding numbers. Thus, it is now possible to selectively and controllably provide state transitions between bubble domains having the same winding number. This transition occurs through the use of homogeneous magnetic fields having no spatial gradients associated therewith. This is a distinct advantage, since these fields are easy to produce and can be localized in, for instance, a generator area of a bubble domain chip. Further, the present invention allows the use of unichiral bubbles in devices, since these bubbles can now be detected by converting them into $\sigma$ bubbles which are distinguishable from one another by the principles of automotion.

In the practice of this invention, it will be realized that principles have been taught herein which allow one to change the magnetization state of a domain so as to produce selected wall magnetizations in a controllable manner. Thus, the teaching of the present invention can be extended by those of skill in the art beyond the teaching of the examples illustratively shown.

The teaching of this invention can be used to provide bubble domain generators for controlled generation of bubble domains having several different magnetic states. This is done reproducibly and controllably and does not require a separate means for providing gradient magnetic fields. Additionally, a capping layer, such as an ion-implanted layer of the bubble domain material, need not be provided for state conversion or for stability. This means that additional processing steps which have been done in the past for bubble domain devices are no longer needed.

Most importantly, the present invention teaches how to selectively change the state of a magnetic bubble domain while preserving its winding number. Combining the teaching of this invention and that set forth in the invention described in aforementioned copending application Ser. No. 659,880 provides devices having advantages over those heretofore known in conventional bubble domain devices.

In the practice of this invention, it will be apparent to those of skill in the art that the rate of change with time of the field $h_z(t)$ for a given $h_s$ is important for changing the BL state of a bubble domain. Thus, the leading or trailing edge of the $h_z(t)$ pulse, or both the leading and trailing edge, can be used to provide selected state changes in accordance with this invention.

What is claimed is:

1. A method for converting a first bubble domain having two vertical Bloch lines therein to a second bubble domain having no vertical Bloch lines therein, comprising the step of applying a spatially uniform magnetic field to said first bubble domain said magnetic field having a rise time and magnitude sufficient to cause said two vertical Bloch lines to collide and annihilate to produce said second bubble domain, said magnitude and rise time being insufficient to generate new Bloch lines in said bubble domain.

2. The method of claim 1, where said magnetic field is a time varying magnetic field.

3. The method of claim 1, including the further step of diminishing the magnitude of said magnetic field in a time period sufficiently long that new Bloch lines are not produced in said second bubble domain when said magnetic field is diminished.

4. The method of claim 1, where said magnetic field is applied in a direction to expand the size of said first bubble domain.

5. The method of claim 1, where said magnetic field is applied in a direction to reduce the size of said first bubble domain.

6. A method of converting a bubble domain from an initial state having no vertical Bloch lines therein to a final state having a pair of unwinding vertical Bloch lines therein, comprising the steps of:
applying a first magnetic field in a direction substantially normal to the direction of magnetization of said bubble domain in its initial state of sufficient magnitude tending to destabilize the magnetic wall state of said initial state domain, and
applying a second magnetic field along the direction of magnetization of said domain, said second field being spatially uniform and time varying and having sufficient magnitude and rate of change with time to generate two vertical Bloch lines in said initial state domain, to produce a domain having a single pair of unwinding vertical Bloch lines therein.

7. The method of claim 6, where said second magnetic field is of sufficient magnitude rate of change with time to produce a single pair of vertical Bloch lines in said initial state bubble domain.

8. The method of claim 6, where said second magnetic field is applied in a direction to expand the size of said initial state domain.

9. The method of claim 6, where said second magnetic field is applied in a direction to reduce the size of said initial state domain.

10. The method of claim 6, where said first magnetic field has a constant amplitude sufficient to destabilize the magnetic wall state of said domain in its initial state and sufficient to keep said vertical Bloch lines of the domain in its final state separated from one another.

11. The method of claim 6, wherein said second magnetic field is diminished in magnitude slowly enough to avoid generating new Bloch lines in said domain in its final state.

12. A method for converting a first unichiral domain having wall magnetization of a first sense to a second unichiral domain having wall magnetization of a second sense, comprising the steps of:

applying a spatially uniform, time varying magnetic field to said first unichiral domain, said magnetic field having a magnitude and rate of change with time sufficient to generate a circular Bloch line in said first unichiral domain, and moving said circular Bloch line along the height of said first unichiral domain to change the sense of chirality of said first domain to that of said unichiral domain.

13. The method of claim 12, where said magnetic field is applied along the direction of magnetization of said first unichiral domain.

14. The method of claim 13, where said magnetic field expands the size of said first unichiral domain.

15. The method of claim 13, where said magnetic field diminishes the size of said first unichiral domain.

16. A method for converting a first magnetic bubble domain having a first wall magnetization state to a second magnetic bubble domain having a second wall magnetization state where said first and second states have the same winding number, and where said first magnetic domain is located in a bubble domain material characterized by the absence of a capping layer thereon, comprising the step of:

applying a time varying, spatially uniform magnetic field in a direction along the magnetization direction of said first magnetic bubble domain, said magnetic field having a magnitude and time rate of change sufficient to change the Bloch line state of said first magnetic bubble domain to the bloch line state of said second magnetic bubble domain, where the dynamical radius of said domain substantially lags behind the quasistatic radius corresponding to the instantaneous magnitude of said magnetic field.

17. The method of claim 16, including the step of applying a second magnetic field to said domain simultaneously with the application of said first magnetic field, said second magnetic field being applied in a direction substantially normal to the direction of magnetization within the body of said first domain.

18. The method of claim 17, where said second magnetic field has a constant amplitude.

19. The method of claim 16, where said magnetic field generates vertical Bloch lines in said first magnetic bubble domain.

20. The method of claim 16, where said magnetic field causes vertical Bloch lines in said first magnetic bubble domain to collide and annihilate. pg,30

21. The method of claim 16, where said magnetic field has sufficient magnitude and rise time to generate a circular Bloch line in said first magnetic bubble domain, which moves in a direction along the length of said first magnetic bubble domain.

22. A method for controllably changing the Bloch line state of a magnetic bubble domain from a first Bloch line state to a selected second Bloch line state, said domain being located in a magnetic medium characterized by the absence thereon of a magnetic capping layer having in-plane magnetization, said state being changed without changing the winding number of said domain, comprising the step of applying a spatially uniform, time-varying magnetic field pulse to said domain, said pulse having a leading edge and a trailing edge, where the magnitude and rate of change of said leading edge are chosen to produce only said selected second Bloch line state in said domain when said field pulse is applied in a direction to change the size of said domain so that its dynamical radius substantially lags behind the quasistatic radius corresponding to the instantaneous magnitude of said magnetic field pulse.

23. The method of claim 22, including the further step of applying a constant magnetic field in the plane of said magnetic medium, at the same time that said time-varying magnetic field pulse is applied.

* * * * *

UNITED STATES PATENT AND TRADEMARK OFFICE
CERTIFICATE OF CORRECTION

PATENT NO. : 4,068,220

DATED : Jan. 10, 1978

INVENTOR(S) : Bernell Edwin Argyle et al

It is certified that error appears in the above-identified patent and that said Letters Patent are hereby corrected as shown below:

Column 1, line 57, "conversion" should read --conversions--.

Column 2, line 17, "Thus," should read --For example,--.

Column 5, lines 5 & 6, "("automode")" should read --("automote")--.

Column 6, line 55, after "far" insert --enough--.

Column 6, line 59, after small change the "," to a --.--.

Column 6, line 60, change "the" to --The--.

Column 7, line 61, "$\gamma$" should read --$\chi$--.

Column 8, line 40, after "wall moment" insert --in the--.

Column 8, line 57, "N+S" should read --$N^+S^-$--.

Column 9, line 29, "upwards" should read --downward--.

Column 10, line 22, "in material" should read --immaterial--.

UNITED STATES PATENT AND TRADEMARK OFFICE
CERTIFICATE OF CORRECTION

PATENT NO. : 4,068,220

DATED : Jan. 10, 1978

INVENTOR(S) : Bernell Edwin Argyle et al

It is certified that error appears in the above-identified patent and that said Letters Patent are hereby corrected as shown below:

Column 10, line 44, "in-lane" should read --in-plane--.

Column 11, line 48, "$x_{30}$" should read --$x_+$--.

Column 14, line 55, after "magnitude" insert --and--.

Signed and Sealed this

Thirtieth Day of May 1978

[SEAL]

Attest:

RUTH C. MASON
Attesting Officer

LUTRELLE F. PARKER
Acting Commissioner of Patents and Trademarks